United States Patent
Wu et al.

(10) Patent No.: US 12,029,090 B2
(45) Date of Patent: Jul. 2, 2024

(54) DISPLAY PANEL AND MANUFACTURING METHOD THEREOF, DISPLAY SCREEN AND DISPLAY DEVICE

(71) Applicant: KUNSHAN GO-VISIONOX OPTO-ELECTRONICS CO., LTD, Jiangsu (CN)

(72) Inventors: Hao Wu, Kunshan (CN); Hanquan Yin, Kunshan (CN); Jing Tang, Kunshan (CN); Jiaoyang Li, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 543 days.

(21) Appl. No.: 17/473,050

(22) Filed: Sep. 13, 2021

(65) Prior Publication Data
US 2021/0408219 A1    Dec. 30, 2021

Related U.S. Application Data

(63) Continuation of application No. PCT/CN2020/084366, filed on Apr. 13, 2020.

(30) Foreign Application Priority Data

Aug. 30, 2019  (CN) .......................... 201910818064.5

(51) Int. Cl.
*H10K 59/173*  (2023.01)
*H10K 50/805*  (2023.01)
(Continued)

(52) U.S. Cl.
CPC ......... *H10K 59/173* (2023.02); *H10K 50/805* (2023.02); *H10K 50/841* (2023.02);
(Continued)

(58) Field of Classification Search
CPC ..... H10K 50/805; H10K 50/841–8428; H10K 59/87; H10K 59/179; H10K 59/122
See application file for complete search history.

(56) References Cited

U.S. PATENT DOCUMENTS

2003/0017360 A1    1/2003   Tai et al.
2004/0140759 A1*   7/2004   Park ..................... H10K 59/173
                                                        313/504
(Continued)

FOREIGN PATENT DOCUMENTS

CN    101621116 A    1/2010
CN    106024836 A    10/2016
(Continued)

OTHER PUBLICATIONS

International Search Report issued on Jul. 15, 2020 in corresponding International Application No. PCT/CN2020/084366; 6 pages.
(Continued)

*Primary Examiner* — Joseph C. Nicely
*Assistant Examiner* — Alvin L Lee
(74) *Attorney, Agent, or Firm* — Maier & Maier, PLLC

(57) ABSTRACT

A display panel includes a substrate; multiple first electrode signal lines formed on the substrate; and multiple isolation columns located on a side of the multiple first electrode signal lines facing away from the substrate. The display panel includes multiple pixel regions and multiple partition regions, each of the multiple pixel regions is internally provided with a respective one of the multiple isolation columns, each of the multiple isolation columns is internally provided with multiple pixel openings, and each of the multiple pixel openings is internally provided with a first electrode and a light-emitting function layer located on a side of the first electrode facing away from the substrate, the first electrode is electrically connected to a corresponding one of the multiple first electrode signal lines, and the (Continued)

multiple partition regions are used for partitioning a second electrode between two adjacent pixel regions.

18 Claims, 14 Drawing Sheets

(51) Int. Cl.
*H10K 50/84* (2023.01)
*H10K 50/842* (2023.01)
*H10K 59/12* (2023.01)
*H10K 59/122* (2023.01)
*H10K 59/179* (2023.01)
*H10K 71/00* (2023.01)

(52) U.S. Cl.
CPC ....... *H10K 50/842* (2023.02); *H10K 50/8423* (2023.02); *H10K 50/8426* (2023.02); *H10K 50/8428* (2023.02); *H10K 59/12* (2023.02); *H10K 59/122* (2023.02); *H10K 59/179* (2023.02); *H10K 71/00* (2023.02)

(56) References Cited

U.S. PATENT DOCUMENTS

| | | | |
|---|---|---|---|
| 2020/0303472 A1* | 9/2020 | Lou | H10K 50/844 |
| 2022/0069029 A1* | 3/2022 | Huang | H10K 50/844 |

FOREIGN PATENT DOCUMENTS

| | | | | |
|---|---|---|---|---|
| CN | 207338380 A | 5/2018 | | |
| CN | 109360900 A | 2/2019 | | |
| CN | 208608202 U | 3/2019 | | |
| CN | 208622778 U | 3/2019 | | |
| CN | 109713015 A | 5/2019 | | |
| CN | 109742114 A | 5/2019 | | |
| CN | 109801950 A | 5/2019 | | |
| CN | 209071332 U | 7/2019 | | |
| CN | 110137226 A | 8/2019 | | |
| CN | 110783482 A | 2/2020 | | |
| JP | 2006048980 A | 2/2006 | | |
| WO | WO-2016000334 A1 * | 1/2016 | ............ | H01L 27/32 |

OTHER PUBLICATIONS

First Office Action issued on Feb. 10, 2021 in corresponding Chinese Application No. 201910818064.5; 16 pages; Machine translation attached.

Second Office Action issued on Jun. 17, 2021 in corresponding Chinese Application No. 201910818064.5; 16 pages; Machine translation attached.

Supplemental Search Report issued on Feb. 21, 2022 in corresponding Chinese Application No. 2019108180645; 3 pages including English-language translation.

* cited by examiner

ND MANUFACTURING
DISPLAY PANEL AND MANUFACTURING METHOD THEREOF, DISPLAY SCREEN AND DISPLAY DEVICE

CROSS-REFERENCE TO RELATED APPLICATIONS

This application is a continuation of International Patent Application No. PCT/CN2020/084366, filed on Apr. 13, 2020, which claims priority to Chinese Patent Application No. 201910818064.5 filed on Aug. 30, 2019, the disclosures of both of which are incorporated herein by reference in their entireties.

TECHNICAL FIELD

The present application relates to the field of display technology, a display panel and a manufacturing method thereof, a display screen, and a display device.

BACKGROUND

With the rapid development of electronic devices, the use requirements for screen to body ratio are increasingly high, so that the full-screen display of the electronic devices is concerned more and more by the industry.

Traditional electronic devices such as a mobile phone, a tablet personal computer need to be integrated with a front-facing camera, an earpiece, an infrared sensing element and the like, so that the cameras, the earpiece and the infrared sensing element may be disposed in a notched region by notching on a display screen, however, the notched region is not used for the display of a picture such as a fringe screen in the related art, or for an electronic device that realizes the camera function, holes are cut on the screen, external light may enter a photosensitive element located below the screen through the holes on the screen. However, these electronic devices are all not a full-screen in a true sense, and cannot display in multiple regions of a whole screen, for example, a picture may not be displayed in a camera region.

SUMMARY

The present application provides a display panel, a manufacturing method thereof and a display screen, which can greatly reduce a thickness of the display panel and thus improve the production efficiency of the display panel while realizing the partition of a second electrode between adjacent pixel regions to realize the full-screen display.

The present application provides a display panel. The display panel includes a substrate; multiple first electrode signal lines formed on the substrate; and multiple isolation columns located on a side of the multiple first electrode signal lines facing away from the substrate. The display panel includes multiple pixel regions and multiple partition regions, each of the multiple pixel regions is internally provided with a respective one of the multiple isolation columns, each of the multiple isolation columns is internally provided with multiple pixel openings, and each of the multiple pixel openings is internally provided with a first electrode and a light-emitting function layer located on a side of the first electrode facing away from the substrate, the first electrode is electrically connected to a corresponding one of the multiple first electrode signal lines, and the multiple partition regions are used for partitioning a plurality of second electrodes between two adjacent pixel regions.

The present application further provides a display screen. The display screen includes at least one first display region provided with at least one display panel described above. The display screen further includes a second display region, the at least one display panel disposed in the at least one first display region is a passive matrix OLED (PMOLED) display panel and is a light-transmitting display panel, and a display panel disposed in the second display region is an active matrix OLED (AMOLED) display panel.

The present application further provides a manufacturing method of a display panel. The manufacturing method is used for manufacturing the display panel described above. The manufacturing method includes: a sacrificial layer is formed on a side of the multiple first electrode signal lines facing away from the substrate, and multiple limiting holes are formed on the sacrificial layer; where an area of a first end of each of the multiple limiting holes adjacent to the substrate is less than an area of a second end of each of the multiple limiting holes facing away from the substrate; a first portion of a corresponding one of the multiple isolation columns is formed within the multiple limiting holes; where an extending direction of the multiple limiting holes is the extending direction of the multiple isolation columns; a via hole penetrating through the first portion is formed, and multiple first electrodes are formed on the first portion; where each of the multiple first electrodes is electrically connected to a corresponding one of the multiple first electrode signal lines through the via hole; a second portion of the multiple isolation columns is formed on the multiple first electrodes, and multiple pixel openings are formed on the second portion; and the sacrificial layer is removed.

The present application provides a display panel, a manufacturing method thereof and a display screen, the display panel is set to include the substrate; the multiple first electrode signal lines formed on the substrate; and the multiple isolation columns located on the side of the multiple first electrode signal lines away from the substrate, the display panel includes the multiple pixel regions and the multiple partition regions, the each of the multiple pixel regions is internally provided with the respective one of the multiple isolation columns, the each of the multiple isolation columns is internally provided with the multiple pixel openings, and the each of the multiple pixel openings is internally provided with the first electrode and the light-emitting function layer located on the side of the first electrode away from the substrate, the first electrode is electrically connected to the corresponding one of the multiple first electrode signal lines, and the multiple partition regions are used for partitioning the plurality of second electrodes between two adjacent pixel regions, in this way, it can greatly reduce the thickness of the display panel and improve the production efficiency of the display panel while realizing the partition of the plurality of second electrodes between adjacent pixel regions to realize the full-screen display.

DETAILED DESCRIPTION

The present application will be described below with reference to the associated drawings. Embodiments of the present application are given in the accompanying drawings. The present application may, however, be embodied in many different forms and is not limited to the embodiments described herein.

Traditional electronic devices need to be integrated with elements, so that a display screen needs to be notched, and thus the elements are disposed in a notched region. However, the notched region is not used for the display of a picture, and the electronic devices are not a full-screen in a real sense and cannot display in multiple regions of a whole screen.

In response to the above-described problems, the skilled person has developed a display screen, and this display screen achieves the full-screen display of the electronic device in a manner that a transparent display panel is disposed in the notched region. According to different driving manners, an organic light-emitting diode (OLED) may be divided into two types, namely, a passive matrix organic light-emitting diode (PMOLED) and an active matrix organic light-emitting diode (AMOLED). The PMOLED is used as an example, electrodes with a same nature in a same row of display units of a PMOLED display array are used in common, and electrodes with a same nature in a same column of display units are also used in common, and due to a fact that a PMOLED display panel is not provided with a thin film transistor (TFT) back plate and a metal wire, so that the light transmittance is high, and the PMOLED may be applied to the transparent display panel described above.

Generally, the PMOLED display panel needs to form an isolation column between two adjacent rows or columns through a photolithography process so as to avoid a short circuit between cathodes of two adjacent rows or columns. In a process of sputtering to form a cathode layer, due to a fact that a moving direction of an metal atoms is uncertain, so that the cathode layer may also be formed on a side wall of the isolation column, the formed cathode layer and the side wall of the isolation column are good in adhesiveness and not prone to falling off, and therefore the cathode layer on the isolation column and a cathode layer on the light-emitting layer are connected into a whole, whereby the cathodes of adjacent rows or columns are short-circuited, the difficulty of cathode blocking is high, and the realization of full-screen normal display is not facilitated.

The present application provides a display panel which may solve the problems described above.

Figure 1:
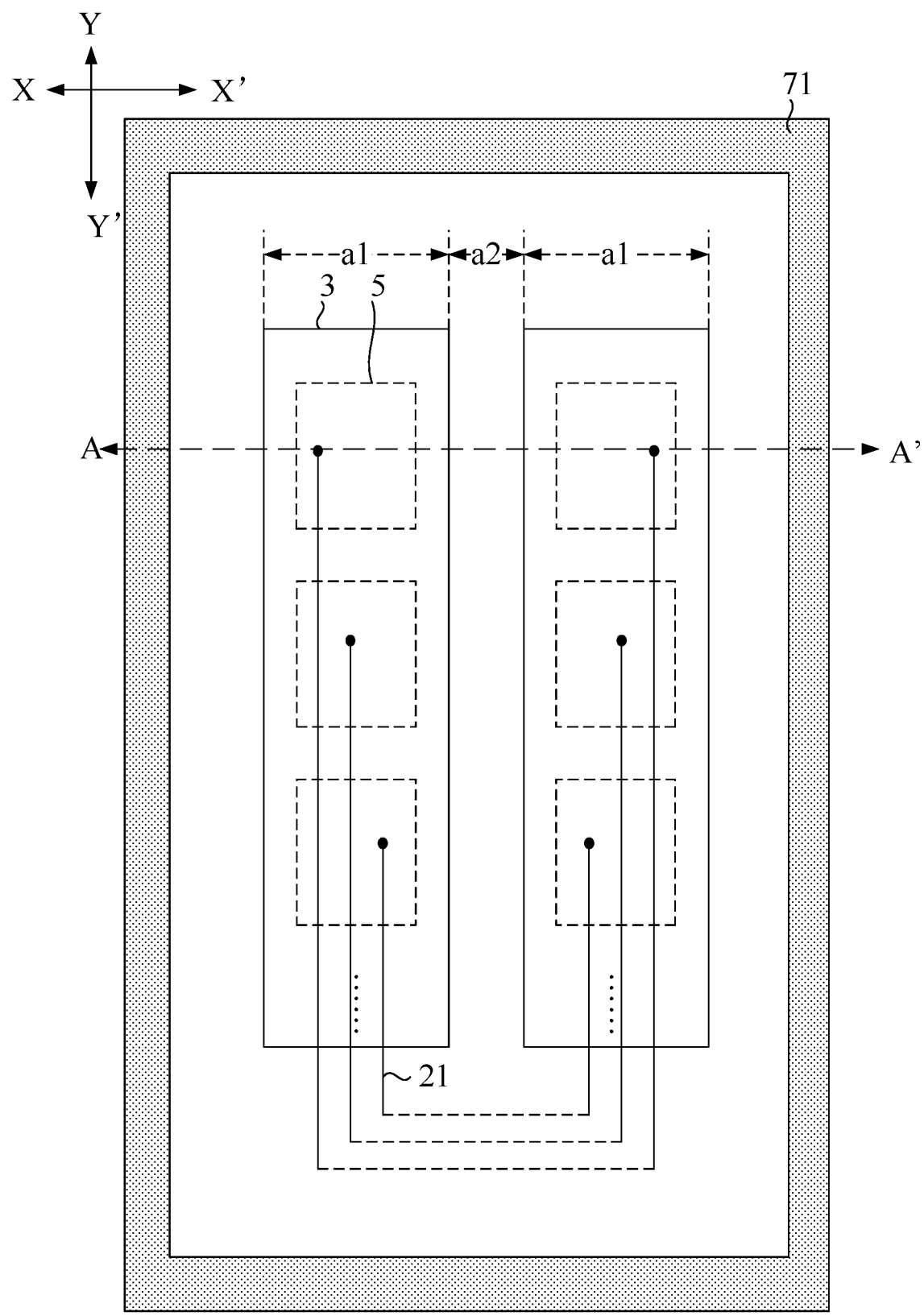
FIG. 1 is a top structural schematic diagram of a display panel provided in an embodiment of the present application.
Figure 2:
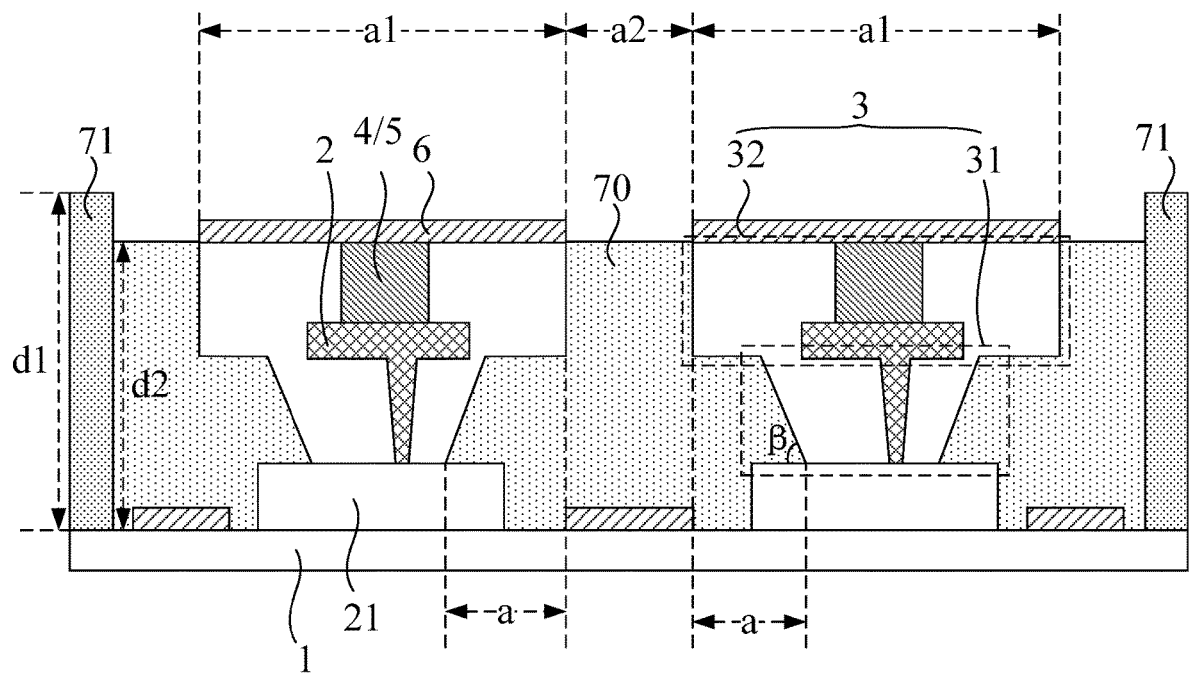
FIG. 2 is cross-sectional structure schematic diagram taken along an AA' direction of FIG. 1.

FIG. 1 is a top structural schematic diagram of a display panel provided in an embodiment of the present application, and FIG. 2 is cross-sectional structure schematic diagram taken along an AA' direction of FIG. 1. In conjunction with FIG. 1 and FIG. 2, the display panel includes a substrate 1, multiple first electrode signal lines 21 formed on the substrate 1, and multiple isolation columns 3 located on a side of the multiple first electrode signal lines 21 facing away from the substrate 1. The display panel includes multiple pixel regions a1 and multiple partition regions a2, each of the multiple pixel regions a1 is internally provided with a respective one of the multiple isolation columns 3, each of the multiple isolation columns 3 is internally provided with multiple pixel openings 5, and each of the multiple pixel openings 5 is internally provided with a first electrode 2 and a light-emitting function layer 4 located on a side of the first electrode 2 facing away from the substrate 1, the first electrode 2 is electrically connected to a corresponding one of the multiple first electrode signal lines 21, and the multiple partition regions a2 are used for partitioning a second electrode 6 between two adjacent pixel regions a1.

In conjunction with FIG. 1 and FIG. 2, the display panel includes the multiple pixel regions a1 and the multiple partition regions a2, the partition regions a2 partition the second electrode 6 between two adjacent pixel regions a1, avoiding a short circuit of the second electrode 6 between two adjacent rows or columns, the display panel forms multiple second electrodes 6 extending in one direction, and each of the second electrodes 6 is set to correspond to a respective one of the pixel regions a1, which is conducive to the realization of a PMOLED display panel, and achieving a full-screen display. In addition, each of the multiple pixel regions a1 is internally provided with the respective one of the multiple isolation columns 3, each of the multiple isolation columns 3 is internally provided with the multiple pixel openings 5, and each of the multiple pixel openings 5 is internally provided with the first electrode 2 and the light-emitting function layer 4 located on the side of the first electrode 2 away from the substrate 1, that is, a pixel structure is disposed within the isolation column 3, and the first electrode 2 is electrically connected to the corresponding one of the multiple first electrode signal lines 21. When the first electrode signal line 21 is used for transmitting a corresponding electrode signal used for achieving a PMOLED display to the first electrode 2, compared with a partition structure disposed on a pixel definition layer to achieve the partition of the second electrode 6, however, in this application, the isolation column 3 is disposed to not only serve as the pixel definition layer to limit a region where the light-emitting function layer 4 is located, but also achieve the partition of the second electrode 6, so that a thickness of the display panel is greatly reduced while the PMOLED display panel is favorably realized and the full-screen display is further realized, namely, a thinning of the display panel is facilitated, manufacturing steps of the display panel are reduced, and thus the production efficiency of the display panel is improved.

Optionally, the substrate 1 may be a hard substrate such as a glass, or may be a flexible substrate such as polyimide (PI), correspondingly, an encapsulation layer in the display panel may also correspond to a hard material such as glass, and the encapsulation layer may also be a thin film encapsulation layer including an inorganic layer and an organic layer which are arranged at intervals.

Optionally, in conjunction with FIG. 1 and FIG. 2, the pixel regions a1 and the partition regions a2 are arranged alternately in a first direction XX', the isolation columns 3 extend in a second direction YY', the pixel openings 5 within the isolation columns 3 are arranged in the second direction YY', the first direction XX' intersects with the second direction YY', here, exemplarily, the first direction XX' is disposed to be perpendicular to the second direction YY'.

In conjunction with FIG. 1 and FIG. 2, the pixel regions a1 and the partition regions a2 are alternately arranged in the first direction XX', and the isolation columns 3 extend in the second direction YY', so that the partition regions a2 extend in the second direction YY', the second electrode 6 extending in the second direction YY' is formed through partition of the partition regions a2, the second electrodes 6 are arranged in the first direction XX', and the second electrodes 6 arranged in the first direction XX' achieve the mutual insulation depending on the partition regions a2, which facilitates a formation of a PMOLED display panel so as to achieve a full-screen display. In addition, the pixel openings 5 within the isolation columns 3 are arranged in the second direction YY', that is, multiple pixels arranged in the second direction YY' are formed in one isolation column 3, so that the display panel integrally includes multiple rows or columns of pixels arranged in the second direction YY', and the pixels within the isolation columns 3 are arranged independently of each other, which provides a basis for subsequently forming the PMOLED display panel to achieve the full-screen display.

Optionally, in conjunction with FIG. 1 and FIG. 2, the isolation column 3 may be disposed in contact with the first electrode signal line 21, the first electrode signal lines 21 extend in the second direction YY', the first electrode 2 is electrically connected to a corresponding one of the multiple first electrode signal lines 21 through a via hole penetrating through part of the multiple isolation columns 3, and in the first direction XX', a vertical projection of the corresponding first electrode signal line 21 electrically connected to the first electrode 2 disposed in each of the multiple isolation columns 3 is located within a vertical projection of the each of the multiple isolation columns 3.

In conjunction with FIG. 1 and FIG. 2, the isolation column 3 may be disposed in contact with the first electrode signal line 21, each of the first electrode signal lines 21 transmits corresponding electrode signals to a corresponding first electrode 2, and the first electrodes 2 are disposed in the pixel openings 5 within the isolation columns 3, so that the first electrode 2 need to be correspondingly and electrically connected to the first electrode signal lines 21 through a via hole penetrating through part of the isolation columns 3; for example, the first electrode 2 may be disposed to be electrically connected to the first electrode signal lines 21 in one-to-one correspondence. In addition, when the second electrode 6 is formed, a material forming the second electrode 6 needs to be used for whole-face evaporation, the second electrode 6 is formed on the isolation column 3 located in the pixel region a1, the partition region a2 located between the adjacent pixel regions a1 partitions the second electrode 6 between the adjacent pixel regions a1, and the material of the partitioned second electrode 6 is also formed in the partition region a2. If the first electrode signal line 21 electrically connected to the first electrode 2 exceed a vertical projection region of a corresponding isolation column 3 in the first direction XX', then materials of the second electrodes 6 in the partition regions a2 enable the first electrode signal lines 21 exceeding the vertical projection regions of the isolation columns 3 to be mutually short-circuited, so that the first electrode signal lines 21 transmitting different first electrode signals are short-circuited, whereby the normal PMOLED display of the display panel is affected; in the present application, in the first direction XX', the vertical projection of the corresponding first electrode signal line 21 electrically connected to the first electrode 2 disposed in each of the multiple isolation columns 3 is located within the vertical projection of the each of the multiple isolation columns 3, so that a material of the second electrode 6 formed in the partition region a2 is insulated from all first electrode signal lines 21, and avoids a problem that the normal PMOLED display of the display panel is affected due to short-circuiting of the first electrode signal lines 21 for transmitting different first electrode signals.

In addition, in conjunction with FIG. 1 and FIG. 2, the PMOLED display panel needs to transmit a first electrode signal and a second electrode signal respectively in mutually perpendicular directions; since the second electrode 6 formed by the partition of the partition region a2 extends in the second direction YY', and a transmission direction of the second electrode signal is the second direction YY', namely, a row of pixels disposed in the second direction YY' receive a same second electrode signal, therefore, a row of pixels disposed in the first direction XX' need to receive a same first electrode signal, and the pixel openings 5 within the isolation columns 3 are independently disposed, the first electrode 2 within the isolation columns 3 are also independently disposed, and the first electrodes 2 are electrically connected to the first electrode signal lines 21 in a one-to-one correspondence manner. Therefore, the first electrode signal lines 21 electrically connected to a row of first electrode 2 arranged in the first direction XX' may be disposed to be in short circuit in the peripheral circuit region of the display screen, and further a transmission direction of the first electrode signal is the first direction XX', that is, a row of pixels disposed in the first direction XX' receive same first electrode signals, and therefore the PMOLED display panel is achieved so as to achieve the full-screen display.

Figure 3:
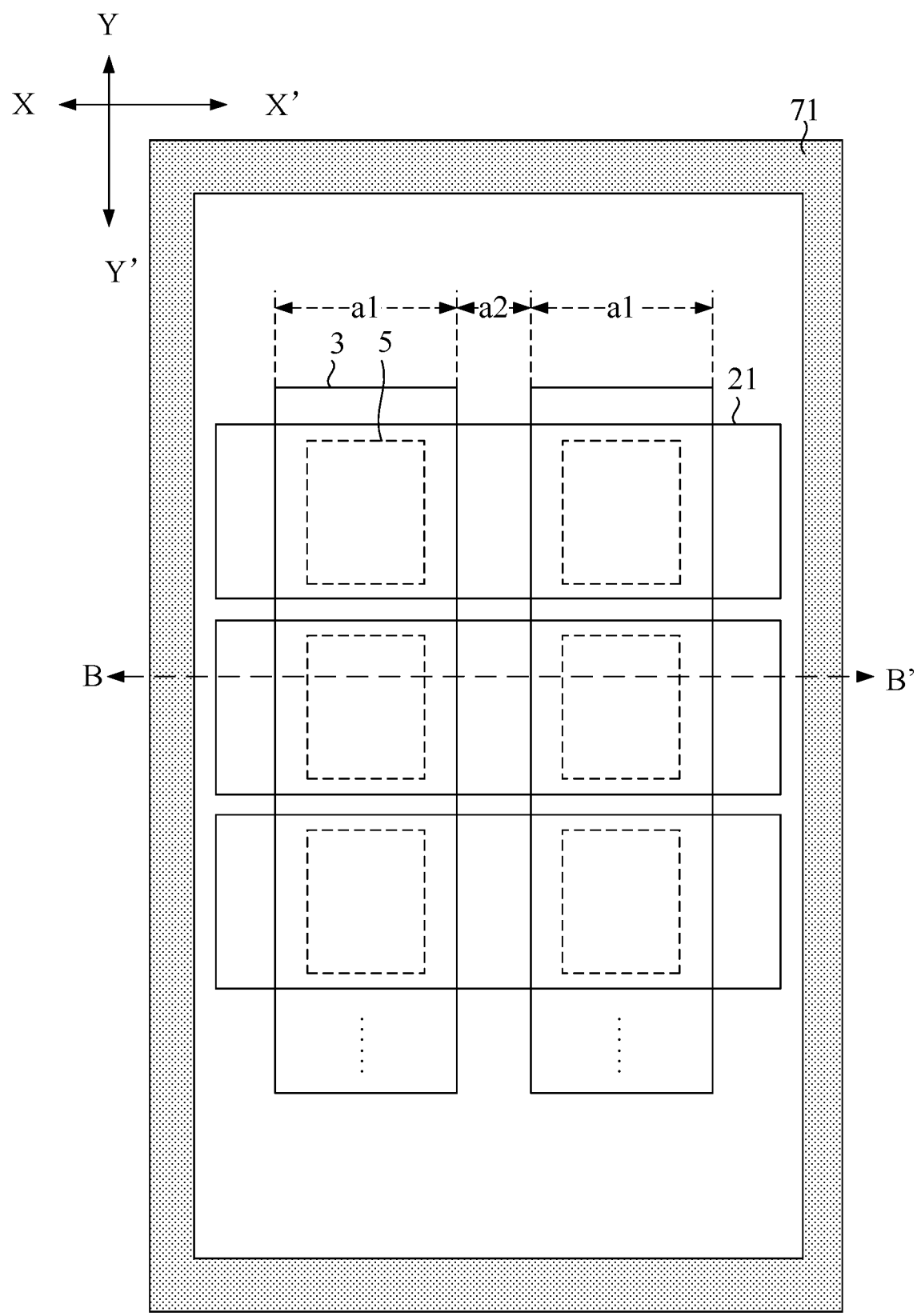
FIG. 3 is a top structural schematic diagram of another display panel provided in an embodiment of the present application.
Figure 4:
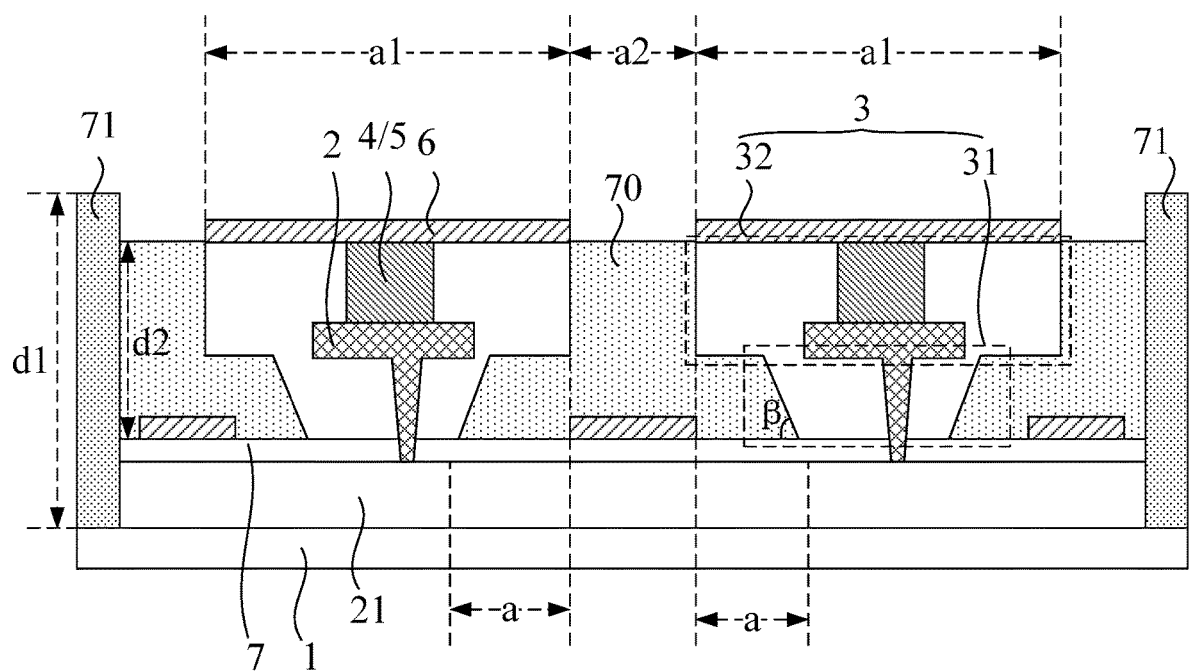
FIG. 4 is cross-sectional structure schematic diagram taken along a BB' direction of FIG. 3.

FIG. 3 is a top structural schematic diagram of another display panel provided in an embodiment of the present application, FIG. 4 is cross-sectional structure schematic diagram taken along a BB' direction of FIG. 3, unlike the display panel of the structure shown in FIGS. 1 and 2, in the display panel of the structure shown in FIGS. 3 and 4, an insulating layer 7 is disposed between the isolation column 3 and the first electrode signal line 21, the first electrode signal line 21 extends in the first direction XX', the first electrode 2 arranged in the first direction XX' are electrically connected to a same first electrode signal line 21 through via holes penetrating through the insulating layer 7 and part of the isolation columns 3, that is, the pixel openings 5 arranged in the first direction XX' are disposed to correspond to a same first electrode signal line 21.

In conjunction with FIGS. 3 and 4, the insulating layer 7 is disposed between the isolation column 3 and the first electrode signal line 21, each of the first electrode signal lines 21 transmits corresponding electrode signals to a corresponding first electrode 2, and the first electrodes 2 are disposed in the pixel openings 5 within the isolation columns 3, so that the first electrode 2 need to be correspondingly and electrically connected to the first electrode signal lines 21 through a via hole penetrating through the insulating layer 7 and part of the isolation columns 3. In addition, when the second electrode 6 is formed, a material forming the second electrode 6 needs to be used for whole-face evaporation, the second electrode 6 is formed on the isolation column 3 located in the pixel region a1, the partition region a2 located between the adjacent pixel regions a1 partitions the second electrode 6 between the adjacent pixel regions a1, and the material of the partitioned second electrode 6 is also formed in the partition region a2. If no insulating layer 7 exists between the isolation column 3 and the first electrode signal lines 21 extending in the first direction XX', then all first electrode signal lines 21 are short-circuited together, namely, the first electrode signal lines 21 transmitting different first electrode signals are short-circuited, and thus a normal PMOLED display of the display panel is affected. In the present application, the insulating layer 7 is disposed between the isolation column 3 and the first electrode signal line 21, so that on a basis that the first electrode signal line 21 extends in the first direction XX', a problem that the normal PMOLED display of the display panel is affected due to a fact that the first electrode signal lines 21 for transmitting different first electrode signals are short-circuited is significantly avoided.

In addition, since the insulating layer 7 is disposed, all first electrode signal lines 21 may extend in the first direction XX', the PMOLED display panel needs to transmit a first electrode signal and a second electrode signal respectively in mutually perpendicular directions; since the second electrode 6 formed by the partition of the partition region a2 extends in the second direction YY', and a transmission direction of the second electrode signal is the second direction YY', namely, a row of pixels disposed in the second direction YY' receive a same second electrode signal, therefore, a row of pixels disposed in the first direction XX' need to receive a same first electrode signal, and the pixel openings 5 within the isolation columns 3 are independently disposed, the first electrode 2 within the isolation columns 3 are also independently disposed, and the first electrode 2 arranged in the first direction XX' are electrically connected to a same first electrode signal line 21 through via holes penetrating through the insulating layer 7 and part of the isolation columns 3, so that a transmission direction of the first electrode signal is the first direction XX', that is, a row of pixels disposed in the first direction XX' receive a same first electrode signals, and therefore the PMOLED display panel is achieved so as to achieve the full-screen display.

Optionally, in conjunction with FIGS. 1 to 4, it may be provided that the isolation column 3 includes a first portion 31 adjacent to the substrate 1 and a second portion 32 away from the substrate 1, in a direction parallel to the substrate 1, a cross-sectional area of the first portion 31 is less than a cross-sectional area of the second portion 32, i.e., in a direction perpendicular to the display panel, a cross-sectional area of the first portion 31 at any height is less than a cross-sectional area of the second portion 32 at any height, in FIG. 4, exemplarily, the first portion is disposed to be an inverted trapezoid shape, the second portion is rectangular, the first electrode 2 is located on a surface of the first portion 31 adjacent to the second portion 32, and the pixel opening 5 penetrates through the second portion 32. The first portion 31 and the second portion 32 of the isolation column 3 may be manufactured and formed in two times, the first electrode 2 may be formed after the first portion 31 of the isolation column 3 is formed, and the light-emitting function layer 4 is disposed in the pixel opening 5 penetrating through the second portion 32 of the isolation column 3 so as to form a pixel structure in the isolation column 3.

In conjunction with FIGS. 1 to 4, the first portion 31 of the isolation column 3 adjacent to the substrate 1 may be understood as a lower half of the isolation column 3 in FIGS. 2 and 4, and the second portion 32 of the isolation column 3 away from the substrate 1 may be understood as an upper half of the isolation column 3 in FIGS. 2 and 4, if the cross-sectional area of the first portion 31 is greater than or equal to the cross-sectional area of the second portion 32 in the direction parallel to the substrate 1, then when the second electrode 6 is manufactured, a material forming the second electrode 6 may climb along a side wall of the isolation column 3, so that the material of the second electrode 6 may also be formed on the side wall of the isolation column 3, whereby the material of the second electrode 6 on the side wall of the isolation column 3 is connected to the second electrode 6 on the light-emitting function layer 4 into a whole; and further, the second electrode 6 between the adjacent pixel regions a1 arranged in the first direction XX' is short-circuited, and thus the normal display of the display panel is affected. The cross-sectional area of the first portion 31 is less than the cross-sectional area of the second portion 32 in the direction parallel to the substrate 1, so that when the second electrode 6 is formed, it is difficult to form a material of the second electrode 6 within a region a in FIGS. 2 and 4, the partition effect of the second electrode 6 in the first direction XX' is optimized, and a probability of the short circuit of the second electrode 6 between the adjacent pixel regions a1 arranged in the first direction XX' is reduced.

Optionally, a material forming the isolation column 3 includes a negative photoresist, and the isolation column 3 of which the cross-sectional area of the first portion 31 adjacent to the substrate 1 is less than the cross-sectional area of the second portion 32 away from the substrate 1 may be conveniently formed by adopting the negative photoresist, so that the partition effect of the isolation column 3 on the second electrode 6 between the adjacent pixel regions a1 is improved, and the negative photoresist has good insulation and is easy to shape, so that the isolation column 3 of which the cross-sectional area of the first portion 31 adjacent to the substrate 1 is less than the cross-sectional area of the second portion 32 away from the substrate 1 may be conveniently formed at one time, and thus the process difficulty of forming the isolation columns 3 of which the cross-sectional area of the first portion 31 adjacent to the substrate 1 is less than the cross-sectional area of the second portion 32 away from the substrate 1 on the display panel is reduced.

FIGS. 2 and 4 only exemplarily show the shape of the isolation column 3, and the present application does not limit the shape of the isolation column 3, it is ensured that the cross-sectional area of the first portion 31 is less than the cross-sectional area of the second portion 32 in the direction parallel to the substrate 1.

Optionally, in conjunction with FIGS. 1 to 4, an included angle ß between a side wall of the first portion 31 of the isolation column 3 adjacent to the substrate 1 and a plane parallel to the substrate 1 may be set to be less than or equal to 75°; the included angle β between the side wall of the first portion 31 of the isolation column 3 adjacent to the substrate 1 and the plane parallel to the substrate 1 determines an inclination degree of the side wall of the first portion 31 of the isolation column 3 adjacent to the substrate 1, and the included angle ß between the side wall of the first portion 31 of the isolation column 3 adjacent to the substrate 1 and the plane parallel to the substrate 1 is the larger, an area of an a region is the larger, which is more conducive to optimizing the partition effect of the isolation column 3 on the second electrode 6 between the adjacent pixel regions a1 arranged in the first direction XX'.

Optionally, the display panel described above may be a transparent or semi-transparent and semi-reflective display panel, such as a PMOLED display panel, and due to a fact that the PMOLED display panel is not provided with a TFT back plate or a metal wire, a light transmittance is high, and high light transmittance is satisfied.

In addition, when a photosensitive element such as a camera are disposed below the display panel, a problem that images obtained through photographing are often blurred to a great extent occurs, and the normal display of a full-screen is not facilitated. One reason for the problem is that due to a fact that conductive wires exist in a display screen of the electronic device, a complex diffraction intensity distribution is caused when external light passes through the conductive wires, whereby diffraction stripes appear, and then a normal work of a photosensitive device such as a camera may be affected. For example, when a camera located below a transparent display region works, the external light is subjected to obvious diffraction after being routed through a wire material in the display screen, so that a picture shot by the camera is distorted.

Optionally, in conjunction with FIGS. 1 to 4, a gap between adjacent isolation columns 3 is filled with a transparent adhesive 70, and after the second electrodes 6 are manufactured, the transparent adhesive 70 may be injected into the gap between the adjacent isolation columns 3 in an ink-jet printing manner, so that the transparent adhesive 70 is filled into the gap between the adjacent isolation columns 3. In order to ensure the light transmittance of the display panel to supply the photosensitive device to collect light, and the transparent adhesive 70 may be made of an organic adhesive having a high transmittance, for example, the transparent adhesive 70 may have a transmittance of 90% or more.

In conjunction with FIGS. 1 to 4, if no transparent adhesive 70 is disposed between adjacent isolation columns 3, a region where the isolation columns 3 are located and a region between the adjacent isolation columns 3 generate an optical path difference to a refractive index of external light, a diffraction phenomenon is generated, and the normal work of the photosensitive device such as a camera is affected. In this application, the transparent adhesive 70 is filled in the gap between the adjacent isolation columns 3, and a refractive index of the transparent adhesive 70 may be set to be close to a refractive index of the isolation columns 3, so that an optical path difference between a region where light penetrates through the isolation columns 3 and a region where light penetrates through the transparent adhesive 70 between the adjacent isolation columns 3 is reduced, and thus a diffraction problem is improved. The transparent adhesive 70 may be made of a material similar to a material forming the isolation column 3, and a thickness ratio of the transparent adhesive 70 to the isolation column 3 may be adjusted in a matched manner to reduce the difference of refractive indexes between the transparent adhesive 70 and the isolation column 3, so that the optical path difference between the region where the light penetrates through the isolation columns 3 and the region where light penetrates through the transparent adhesive 70 between the adjacent isolation columns 3 is reduced, and thus the diffraction problem is improved. Optionally, the refractive index of the transparent adhesive 70 may be set to be the same as that of the isolation column 3, so that the optical path difference between the region where the light penetrates through the isolation columns 3 and the region where light penetrates through the transparent adhesive 70 between the adjacent isolation columns 3 is eliminated, and thus the diffraction problem is improved.

In addition, when the display panel is a flexible display panel, if no transparent adhesive 70 is disposed between adjacent isolation columns 3, then a large space is formed between adjacent isolation columns 3, in a bending process of the display panel, the isolation columns 3 have the collapse risk, the isolation columns 3 collapse to directly destroy a structure of the pixel region a1, and therefore the normal display of the display panel cannot be achieved. In this application, the transparent adhesive 70 is filled in the gap between the adjacent isolation columns 3, so that in the bending process of the display panel, the risk of collapse of the isolation columns 3 is significantly reduced, a problem that the display panel cannot perform the normal display due to a fact that the structure of the pixel region a1 is directly damaged by collapse of the isolation columns 3 is improved, and the stability of the display panel is improved.

Optionally, in conjunction with FIGS. 1 to 4, a surface of the transparent adhesive 70 away from the substrate 1 may be set to be lower than a surface of the isolation column 3 away from the substrate 1, or the surface of the transparent adhesive 70 away from the substrate 1 is flush with the surface of the isolation column 3 away from the substrate 1, namely, a surface of the transparent adhesive 70 away from the substrate 1 is set to be not higher than the surface of the isolation column 3 away from the substrate 1. FIGS. 2 and 4 exemplarily provide that the surface of the transparent adhesive 70 away from the substrate 1 is flush with the surface of the isolation columns 3 away from the substrate 1.

In conjunction with FIGS. 1 to 4, an organic adhesive formed in an ink-jet printing manner is liquid and has fluidity before curing, if the surface of the transparent adhesive 70 away from the substrate 1 is higher than the surface of the isolation column 3 away from the substrate 1, the flowing transparent adhesive 70 has the risk of polluting the light-emitting function layer 4, and thus the normal display of the display panel is affected; the surface of the transparent adhesive 70 away from the substrate 1 is set to be lower than the surface of the isolation column 3 away from the substrate 1, or the surface of the transparent adhesive 70 away from the substrate 1 is flush with the surface of the isolation column 3 away from the substrate 1, so that the problem that flowing transparent adhesive 70 pollutes the light-emitting function layer 4 and affects the normal display of the display panel is significantly avoided.

Optionally, the surface of the transparent adhesive 70 away from the substrate 1 is flush with the surface of the isolation column 3 away from the substrate 1, in conjunction with FIGS. 1 to 4, if the surface of the transparent adhesive 70 away from the substrate 1 is lower than the surface of the isolation column 3 away from the substrate 1, then air may participate in refraction of the region where the transparent adhesive 70 between the adjacent isolation columns 3 is located, which increases the difficulty of setting the material and thickness of the transparent adhesive 70. The surface of the transparent adhesive 70 away from the substrate 1 is set to be flush with the surface of the isolation column 3 away from the substrate 1, which simplifies a setting process of the material and thickness of the transparent adhesive 70. In addition, the surface of the transparent adhesive 70 away from the substrate 1 is flush with the surface of the isolation column 3 away from the substrate 1, which is beneficial to improve the flatness of the transparent adhesive 70 and the second electrode 6, and thus improve the encapsulation effect of the encapsulation layer located above the second electrode 6.

Optionally, in conjunction with FIGS. 1 to 4, the display panel further includes a dam 71 disposed in a bezel region of the display panel and disposed around all isolation columns 3, a thickness d1 of the dam 71 is greater than a thickness d2 of the transparent adhesive 70, and the dam 71 is configured to block the transparent adhesive 70. In conjunction with FIGS. 1 to 4, the dam 71 is disposed around the all isolation columns 3, the thickness d1 of the dam 71 is larger than the thickness d2 of the transparent adhesive 70, the dam 71 is used for blocking the transparent adhesive 70, so that a problem of the increase of a bezel of the display panel caused by the flowing of the transparent adhesive tape 70a is significantly avoided.

Optionally, in conjunction with FIGS. 1 to 4, the dam 71 may be set to be made simultaneously with at least part of the isolation columns 3, the isolation columns 3 is made in sections, for example, the dam 71 may be set to be formed when the second portion 32 of the isolation column 3 away from the substrate 1 is formed, or a portion of the dam 71 adjacent to the substrate 1 may be set to be formed firstly when the first portion 31 of the isolation columns 3 adjacent to the substrate 1 is formed, and then a portion of the dam 71 away from the substrate 1 may be set to be formed when the second portion 32 of the isolation column 3 away from the substrate 1 is formed, so that a manufacturing process of the display panel is simplified.

Figure 5:
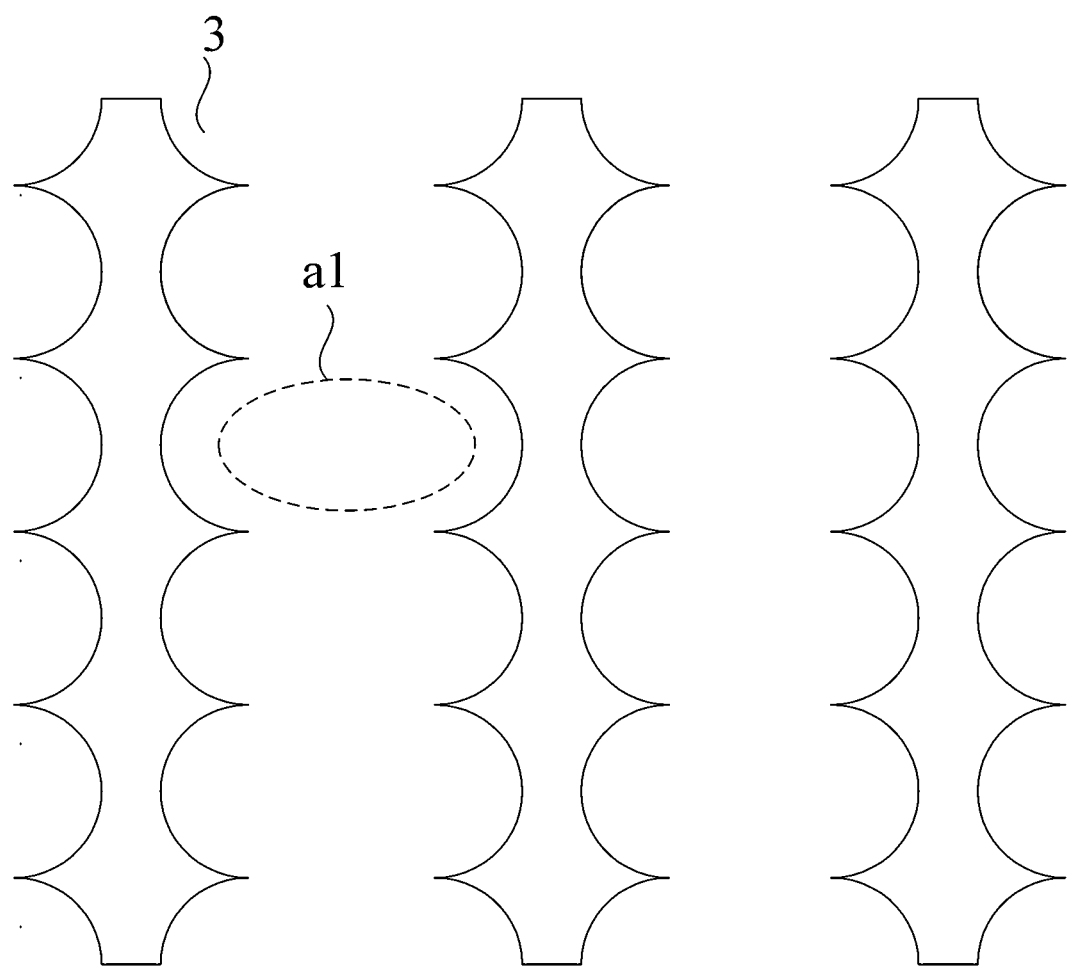
FIG. 5 is a top structural schematic diagram of an isolation column provided in an embodiment of the present application.

FIG. 5 is a top structural schematic diagram of an isolation column provided in an embodiment of the present application. In conjunction with FIGS. 1 to 5, in an extending direction of the isolation columns 3, a width of a vertical projection of the isolation column 3 on the substrate 1 may be set to change continuously or intermittently along a direction perpendicular to the extending direction.

In conjunction with FIGS. 1 to 5, a diffraction phenomenon occurs when external light passes through the isolation column 3, and the diffraction is a physical phenomenon that light waves deviate from original linear propagation when encountering obstacles. Light waves may be bent and spread to different degrees after passing through obstacles such as slits, small holes, or discs. When external light passes through the isolation column 3, the isolation column 3 serving as an obstacle may cause diffraction when the light passes through, and a position of diffraction fringes of the light is determined by maximum widths at multiple positions. Therefore, it only needs to be ensured that the isolation column 3 has a variable maximum width in the extending direction of the isolation column 3, and continuous width change means that widths at any two adjacent positions of the isolation column 3 are different in the extending direction of the isolation column 3. The intermittent width change means that widths of two adjacent positions within a partial region of the isolation column 3 are the same, while widths of two adjacent positions in the partial region are different in the extending direction of the isolation column 3. As such, in the extending direction of the isolation column 3, the width of the vertical projection of the isolation column 3 on the substrate 1 may be set to change continuously or intermittently along the direction perpendicular to the extending direction, and when external light passes through the isolation column 3, positions of diffraction fringes generated at different maximum width positions are different, which makes the diffraction less obvious and achieves the effect of improving the diffraction. In addition, multiple isolation columns 3 are disposed on the substrate 1 in parallel in the first direction XX', so that a diffraction effect at multiple positions of the display panel may be uniformly improved, and thus the purpose of integrally improving the diffraction effect of the display panel is achieved.

Figure 6:
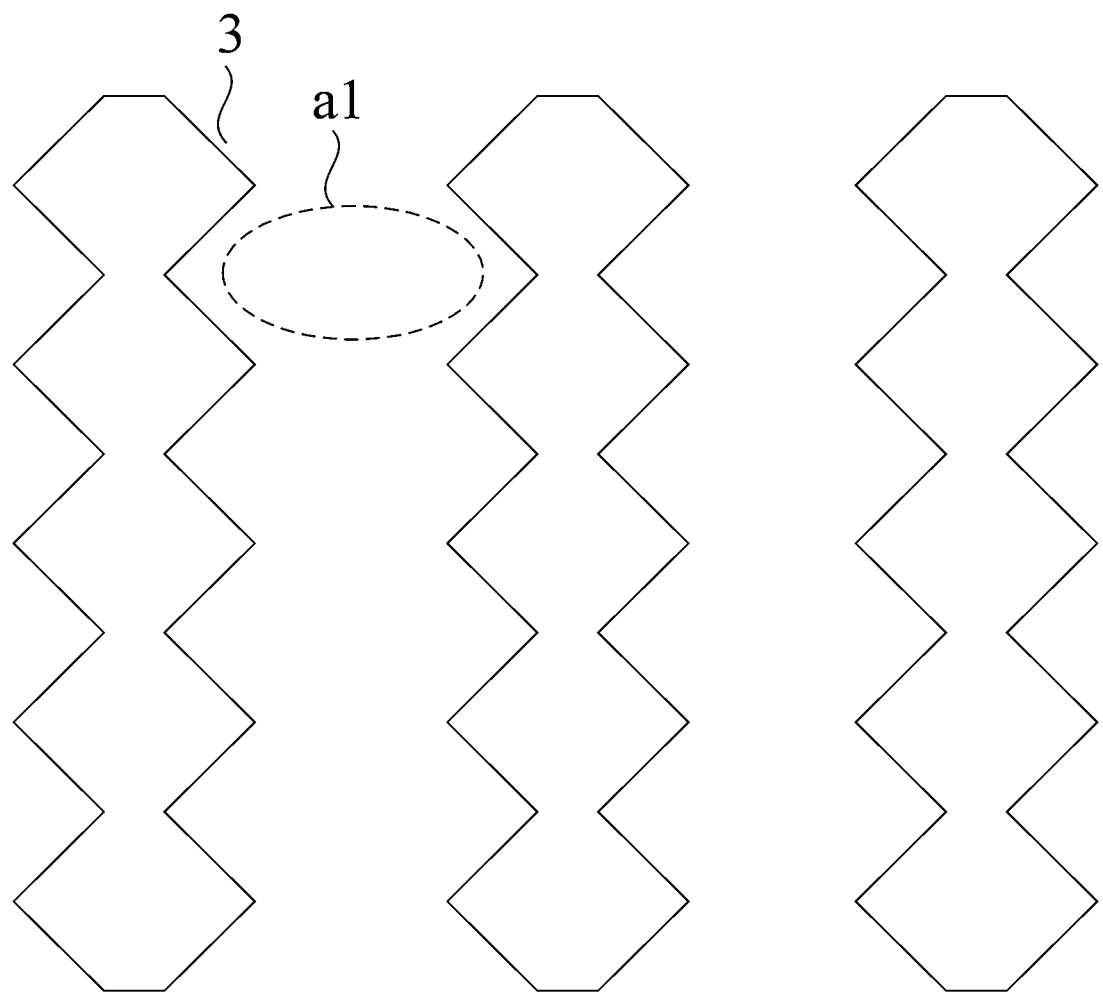
FIG. 6 is a top structural schematic diagram of another isolation column provided in an embodiment of the present application.

Optionally, as shown in FIG. 5, the isolation columns 3 have a periodically varying width in their own extending direction, i.e., a width variation of the isolation column 3 is not irregularly varying but regularly periodically varying so as to reduce the difficulty of an overall manufacture process. Exemplarily, as shown in FIGS. 5 and 6, one width variation period of the isolation column 3 may be set to correspond to one pixel region a1, at least one side edge close to the pixel region of the vertical projection of the isolation column on the substrate is non-straight line shape, for example, the non-straight line shape may include at least one of a broken line segment, an arc shape or a wave shape, that is, the non-straight line shape may be composed of at least one of a fold line, an arc line or the wave shape.

Figure 7:
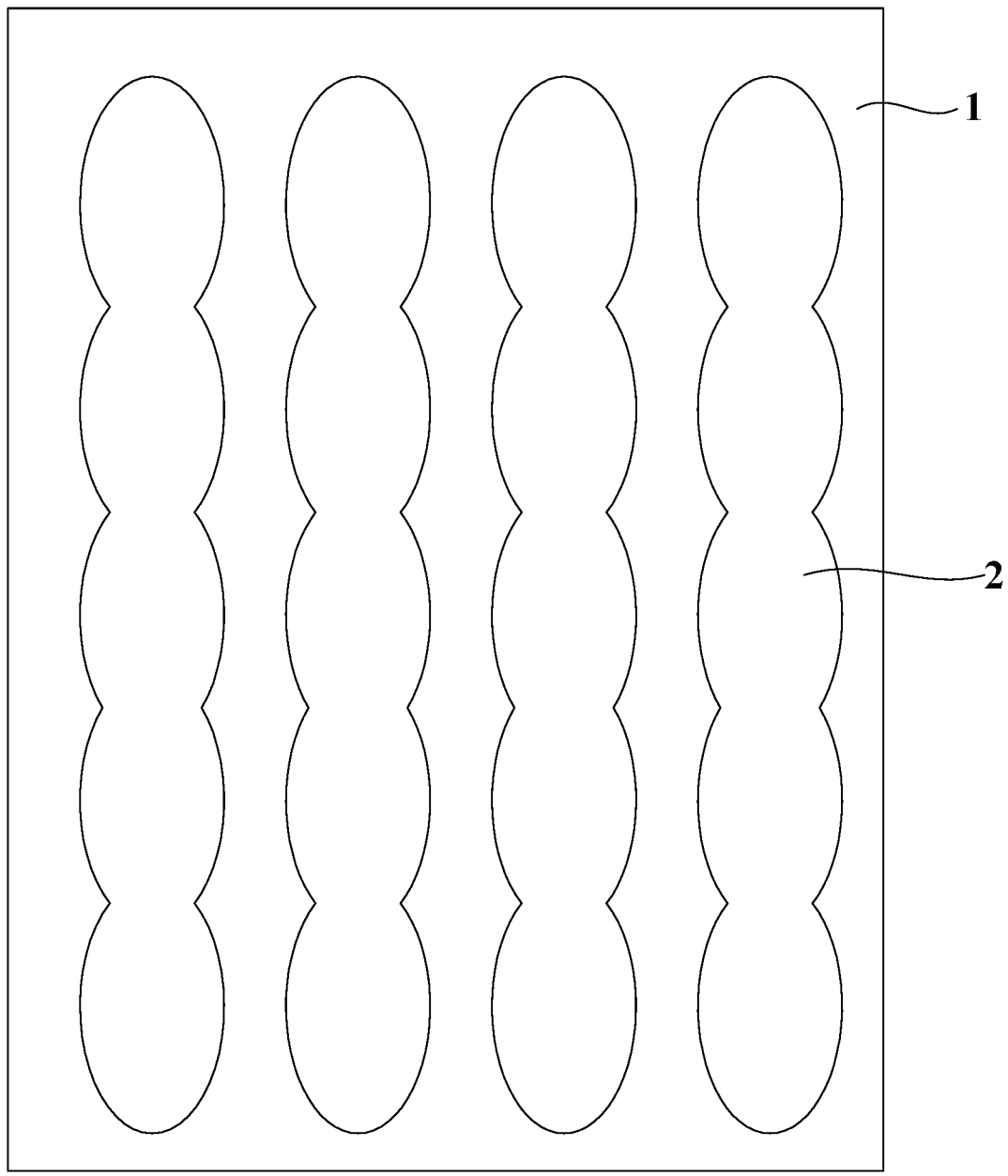
FIG. 7 is a top structural schematic diagram of a first electrode provided in an embodiment of the present application.

FIG. 7 is a top structural schematic diagram of a first electrode provided in an embodiment of the present application. In conjunction with FIGS. 1 to 7, a width of the first electrodes may be set to change continuously or intermittently in an extending direction of the first electrode, and an interval between the first electrodes changes continuously or intermittently.

Optionally, as shown in FIG. 7, the first electrode 2 may be disposed to extend in a wave shape, a width of the first electrode 2 is continuously changed or intermittently changed in the extending direction of the first electrode 2, and the continuous change of the width means that widths at any two adjacent positions on the first electrode 2 are different; the intermittent width change means that widths of two adjacent positions within a partial region of the first electrode 2 are the same, while widths of two adjacent positions in the partial region are different. Optionally, the multiple first electrode 2 are regularly disposed on the substrate 1, so that the gap between two adjacent first electrode 2 also changes continuously or intermittently in an extending direction parallel to the first electrode 2. In the extending direction of the first electrode 2, whether the width of the first electrode 2 changes continuously or intermittently, the first electrode 2 may change periodically, and a length of one change period may correspond to a width of one pixel.

In the extending direction of the first electrode 2, widths of the first electrode 2 change continuously or intermittently, so that adjacent first electrodes 2 have a continuously-changing interval or an intermittently-changing interval. Therefore, positions of the generated diffraction fringes are different at different width positions of the first electrode 2 and between different intervals of adjacent first electrode 2, and derivative effects at different positions are mutually counteracted, so that the diffraction effect may be significantly weakened, and it is ensured that when the camera is disposed below this transparent display panel, a picture obtained by photographing has relatively high definition.

Optionally, the display panel described above is a light-transmitting display panel, a light sensing device may be disposed below the display panel, the display panel may normally display dynamic or static pictures when the light sensing device does not work, and when the light sensing device works, a display content of the display panel is changed according to requirements, for example, an external image which is being shot is displayed, or the display panel may be in a non-display state, the display panel is set to be a light-transmitting display panel, so that the photosensitive device may normally collect light through the display panel.

Optionally, the light transmittance of the display panel may be set to be larger than 15% so as to improve the efficiency that the photosensitive device may collect light through the display panel, and then the working state of the photosensitive device is optimized, for example, if the photosensitive element is a camera, then the definition of a photographed picture or a photographed video may be optimized. In order to ensure that the light transmittance of the display panel is greater than 15%, even greater than 40% and even higher, a light transmittance of multiple functional film layers of the display panel in this embodiment is greater than 80%, and even the light transmittance of the multiple functional film layers is greater than 90%.

Optionally, in conjunction with FIGS. 1 to 7, both the first electrode 2 and the second electrode 6 may be provided as light-transmitting electrodes, and the first electrode signal line 21 may be provided as a light-transmitting signal line to improve the light transmittance of the display panel. Exemplarily, a material constituting the first electrode 2 may be set to be indium tin oxide (ITO) or indium zinc oxide (IZO), a material constituting the second electrode 6 may be set to be ITO, IZO, or a light-transmitting metal material, or the material constituting the first electrode 2 and the second electrode 6 may be set to be ITO, IZO, silver-doped indium tin oxide (Ag+ITO), silver-doped indium zinc oxide (Ag+IZO), or the like. The material constituting the first electrode signal line 21 may be set to be ITO, IZO, Ag+ITO, or Ag+IZO, and a material of the insulating layer may be selected to be silicon dioxide ($SiO_2$), silicon nitride ($SiN_x$), or the like.

Figure 8:
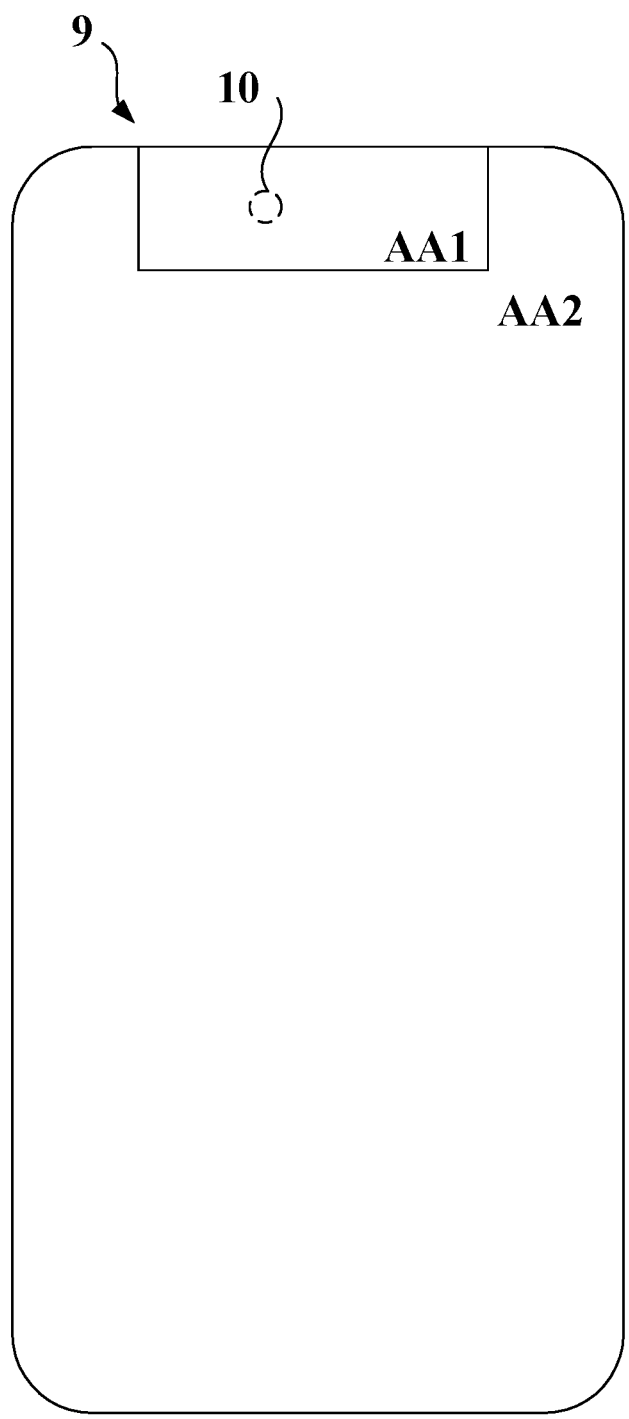
FIG. 8 is a top structural schematic diagram of a display screen provided in an embodiment of the present application.

The present application further provides a display screen. FIG. 8 is a top structural schematic diagram of a display screen provided in an embodiment of the present application. In conjunction with FIGS. 1 to 8, the display screen 9 includes at least one first display region AA1 provided with the display panel as described above. In FIG. 8, exemplarily, the display screen 9 is set to include one first display region AA1, or the display screen 9 may be set to include multiple first display regions AA1, the display screen 9 further includes a second display region AA2, the display panel disposed in the first display region AA1 is a PMOLED display panel, the display panel disposed in the second display region AA2 is an AMOLED display panel, and the display panel disposed in the first display region AA1 is a light-transmitting display panel.

In conjunction with FIGS. 1 to 8, the first display region AA1 and the second display region AA2 are both used for displaying dynamic or static pictures, the photosensitive device 10 may be disposed below the first display region AA1, since the first display region AA1 adopts the display panel described above, so that it has the beneficial effects of the above-described embodiment, which however are not to be detailed herein again. When light passes through the first display region AA1, a relatively obvious diffraction effect cannot be generated, so that the photosensitive device 10 located below the first display region AA1 may be ensured to work normally.

In addition, the first display region AA1 may normally carry out dynamic or static picture display when the photosensitive device 10 does not work, and when the photosensitive device 10 works, the first display region AA1 changes along with the change of a display content of a whole display screen 9, for example, the first display region AA1 displays an external image which is being shot, or the first display region AA1 may also be in a non-display state, whereby it is ensured that the photosensitive device 10 may normally collect light through the display panel.

In conjunction with FIGS. 1 to 8, a light transmittance of the first display region AA1 is greater than a light transmittance of the second display region AA2, or the light transmittance of the first display region AA1 and the light transmittance of the second display region AA2 may be set to be the same, so that a whole display screen 9 has good light transmittance uniformity, and it is ensured that the display screen 9 has a good display effect. Exemplarily, the display panel disposed in the second display region AA2 may be an AMOLED display panel or an AMOLED-like display panel, and the AMOLED-like display panel refers to a display panel having a pixel circuit including only one switch element, i.e., a driving switch, and having no capacitor structure. Other structures of the AMOLED-like display panel are the same as those of the AMOLED display panel, so that a full-screen composed of the PMOLED display panel and the AMOLED display panel is formed.

When the transparent or semi-transparent and semi-reflective display panel disposed in the first display region AA1 is in a working state, a picture may be normally displayed, and when the display panel is in other function requirement states, external light may penetrate through this display panel to irradiate a photosensitive device and the like disposed below the display panel.

Figure 9:
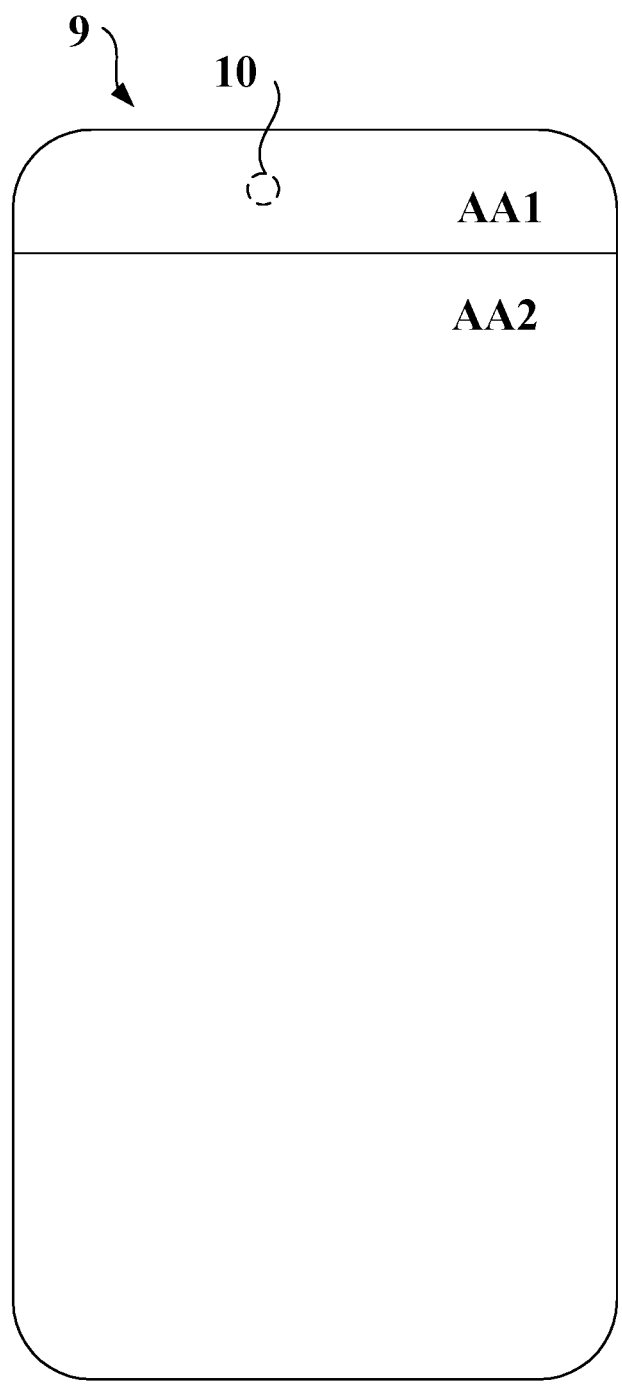
FIG. 9 is a top structural schematic diagram of another display screen provided in an embodiment of the present application.
Figure 10:
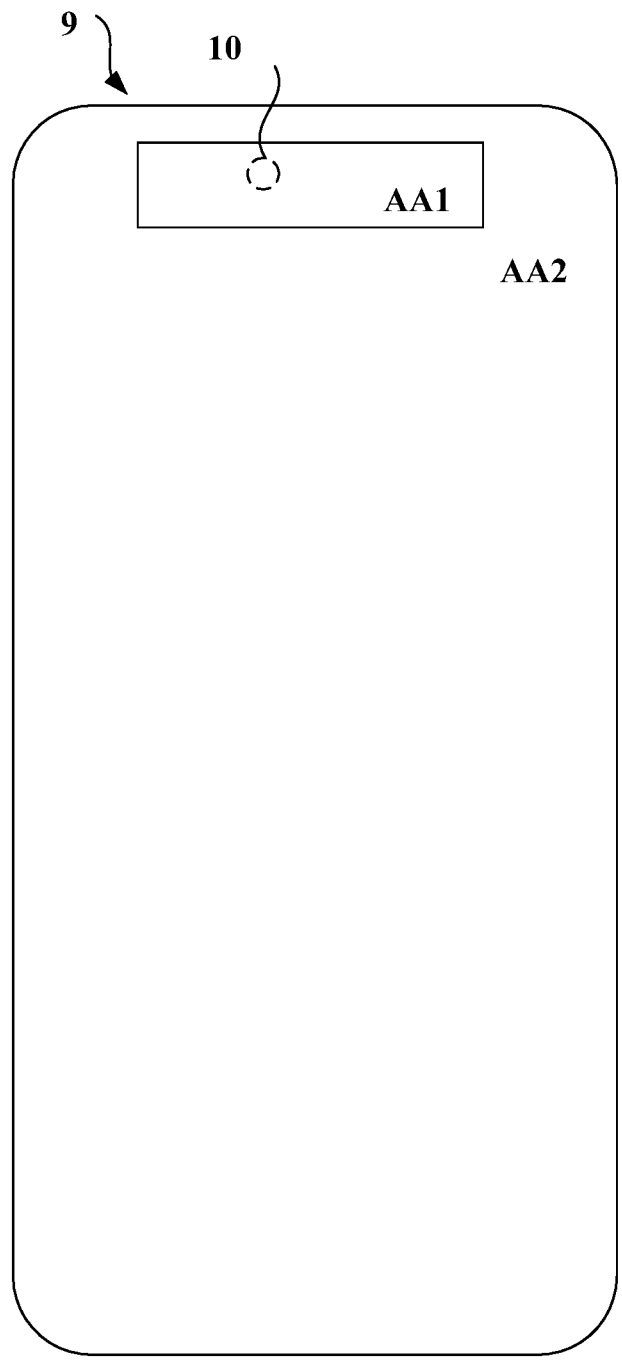
FIG. 10 is a top structural schematic diagram of still another display screen provided in an embodiment of the present application.

Optionally, the second display region AA2 may be provided completely or partially around the at least one first display region AA1, in FIG. 8, exemplarily, the second display region AA2 is disposed to dispose partially around the first display region AA1, i.e. the second display region AA2 is disposed to surround a left side, a right side and a lower side of the first display region AA1, i.e. the first display region AA1 of the PMOLED display panel is adopted to cover a groove region, it may also be shown in FIG. 9, the second display region AA2 is partially disposed around the first display region AA1, and the second display region AA2 is disposed around the lower frame of the first display region AA1, namely the first display region AA1 of the PMOLED display panel is adopted to cover a whole status bar region, it may also be shown in FIG. 10, the second display region AA2 is completely disposed around the first display region AA1, namely, the second display region AA2 surrounds four borders of the first display region AA1. In addition, in FIGS. 8 to 10, exemplarily, a shape of the first display region AA1 is disposed to be rectangular or quasi-rectangular, the quasi-rectangular, that is, four corners of the rectangle may be corners with arcs, or the shape of the first display region AA1 may be disposed to be trapezoidal or circular or other shapes, and the shape of the first display region AA1 may be set according to a requirement of a display product.

Optionally, the PMOLED display panel disposed in the first display region AA1 may be manufactured independently and then spliced with the AMOLED display panel disposed in the second display region AA2 so as to form the display screen with both the AMOLED display panel and the PMOLED display panel, or the AMOLED display panel and the PMOLED display panel may be disposed to be manufactured simultaneously so as to form the display screen with both the AMOLED display panel and the PMOLED display panel.

Figure 11:
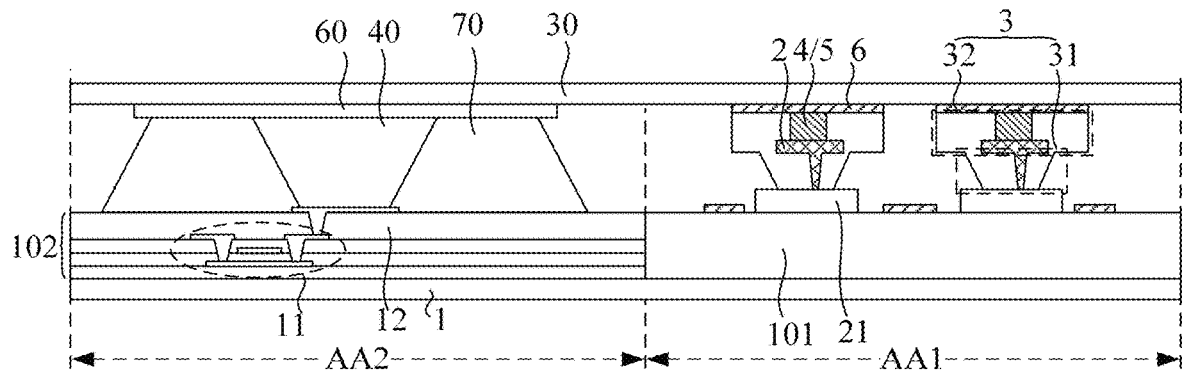
FIG. 11 is a cross-sectional structure schematic diagram of a display screen provided in an embodiment of the present application.

FIG. 11 is a cross-sectional structure schematic diagram of a display screen provided in an embodiment of the present application. In conjunction with FIGS. 2 and 11, a thickness of the display panel disposed in the at least one first display region AA1 is the same as that of the display panel disposed in the second display region AA2, and the AMOLED display panel in the second display region AA2 further includes an array substrate compared with the PMOLED display panel in the first display region AA1. An insulating layer may be disposed in the first display region AA1, so that a thickness of the PMOLED display panel of the first display region AA1 is the same as that of the AMOLED display panel of the second display region AA2, and then a surface of the display screen including the first display region AA1 and the second display region AA2 is smooth. Exemplarily, corresponding to the first display region AA1, an insulating layer 101 may be disposed on the substrate, so that the thickness of the insulating layer 101 is equal to the thickness of the array substrate 102 in the second display region AA2, namely, the thickness of the insulating layer 101 is equal to a sum of thicknesses of all film layers of the thin film transistor 11 in the array substrate 102 in the second display region AA2 and a thickness of a planarization layer 12; in addition, a sum of the thickness of the isolation columns 3 in the PMOLED display panel of the first display region AA1 and the thickness of the first electrode signal line 21 may be set to be equal to a thickness of a pixel definition layer 70 in the AMOLED display panel of the second display region AA2, so that the thickness of the display panel disposed in the first display region AA1 is the same as the thickness of the display panel disposed in the second display region AA2, whereby the surface of the display screen compatible with the AMOLED display panel and the PMOLED display panel is smooth.

Figure 12:
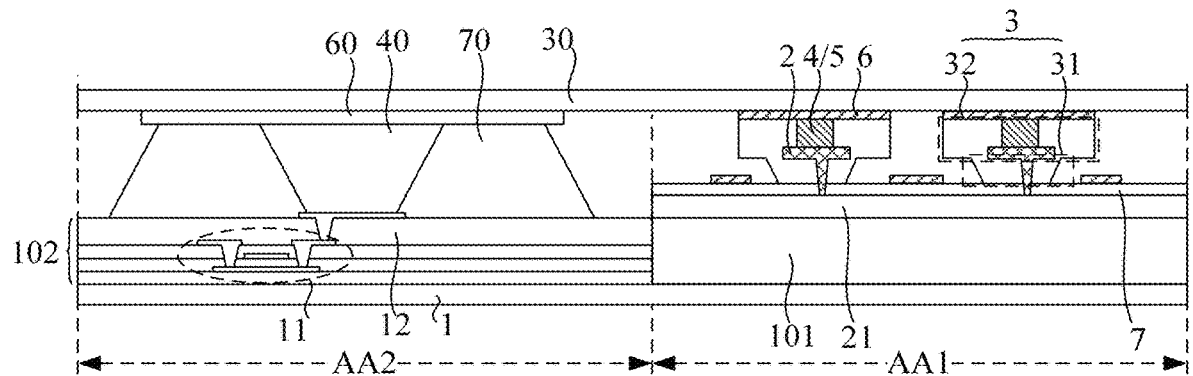
FIG. 12 is a cross-sectional structure schematic diagram of another display screen provided in an embodiment of the present application.

FIG. 12 is a cross-sectional structure schematic diagram of another display screen provided in an embodiment of the present application. In conjunction with FIGS. 4 and 12, the display panel disposed in the first display region AA1 and the display panel disposed in the second display region AA2 have a same thickness, and similarly, corresponding to the first display region AA1, an insulating layer 101 may be disposed on the substrate 1, so that the thickness of the insulating layer 101 is equal to the thickness of the array substrate 102 in the second display region AA2, namely, the thickness of the insulating layer 101 is equal to a sum of thicknesses of all film layers of the thin film transistor 11 in the array substrate 102 in the second display region AA2 and a thickness of a planarization layer 12. In addition, a sum of thicknesses of the isolation column 3, the insulation layer 7 and the first electrode signal line 21 in the PMOLED display panel of the first display region AA1 may be set to be equal to a thickness of a pixel definition layer 70 in the AMOLED display panel of the second display region AA2, so that the thickness of the display panel disposed in the first display region AA1 is the same as the thickness of the display panel disposed in the second display region AA2, whereby the surface of the display screen compatible with the AMOLED display panel and the PMOLED display panel is smooth.

Optionally, in conjunction with FIGS. 11 and 12, part of film layers of the display panel disposed in the first display region AA1 may be disposed to be manufactured simultaneously with part of film layers of the display panel disposed in the second display region AA2, exemplarily, in conjunction with FIGS. 11 and 12, the light-emitting function layer 4 in the display panel disposed in the at least one first display region AA1 is disposed to be manufactured simultaneously with the light-emitting function layer 40 in the display panel disposed in the second display region AA2, so that the manufacturing process of the display screen is simplified. In addition, the display panel disposed in the at least one first display region AA1 and the display panel disposed in the second display region AA2 may share the substrate 1 and the encapsulation layer 30, the substrate 1 may be made of a hard material such as glass, and correspondingly, the encapsulation layer 30 may also be made of glass, and the substrate 1 may also be made of a flexible material such as PI (polyimide), and correspondingly, the encapsulation layer 30 may adopt a thin film encapsulation layer including alternately disposed organic and inorganic layers.

Optionally, a thickness of the second electrode 6 in the display panel disposed in the first display region AA1 is less than a thickness of the second electrode 60 in the display panel disposed in the second display region AA2, the requirement of the first display region for the transmittance of the second electrode is better, and the thickness of the second electrode 6 disposed in the first display region AA1 influences the transmittance of the second electrode 6. The thickness of the second electrode 6 in the display panel disposed in the first display region AA1 is set to be less than that of the second electrode 60 in the display panel disposed in the second display region AA2, so that the transparency of the second electrode 6 in the display panel disposed in the first display region AA1 is improved, and a light collection rate of the photosensitive device disposed in the first display region AA1 is improved.

Optionally, the display panel disposed in the first display region AA1 has relatively high light transmittance and may be realized by adopting a multi-layer material with relatively good light transmittance. For example, multiple layers are made of materials with the light transmittance larger than 90%, and therefore the light transmittance of a whole display panel may be 70% or more. Optionally, the multiple structural film layers are made of materials with the light transmittance larger than 95%, so that the light transmittance of the display panel is improved, and even the light transmittance of the whole display panel is 80% or more.

Optionally, the display screen may further include a polaroid and a cover plate which are located above the encapsulation layer, the cover plate may also be directly disposed above the encapsulation layer, and the polaroid does not need to be disposed, or the cover plate does not need to be directly disposed at least above the encapsulation layer of the first display region, and the polaroid does not need to be disposed, which prevents the polaroid from affecting the light collection amount of the photosensitive element disposed in a corresponding first display region, and certainly, the polaroid may also be disposed above the encapsulation layer of the first display region AA1.

Figure 13:
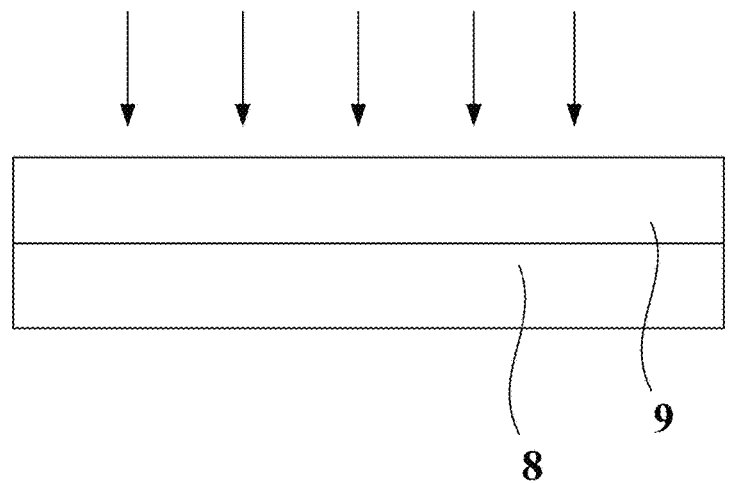
FIG. 13 is a cross-sectional structure schematic diagram of a display panel provided in an embodiment of the present application.
Figure 14:
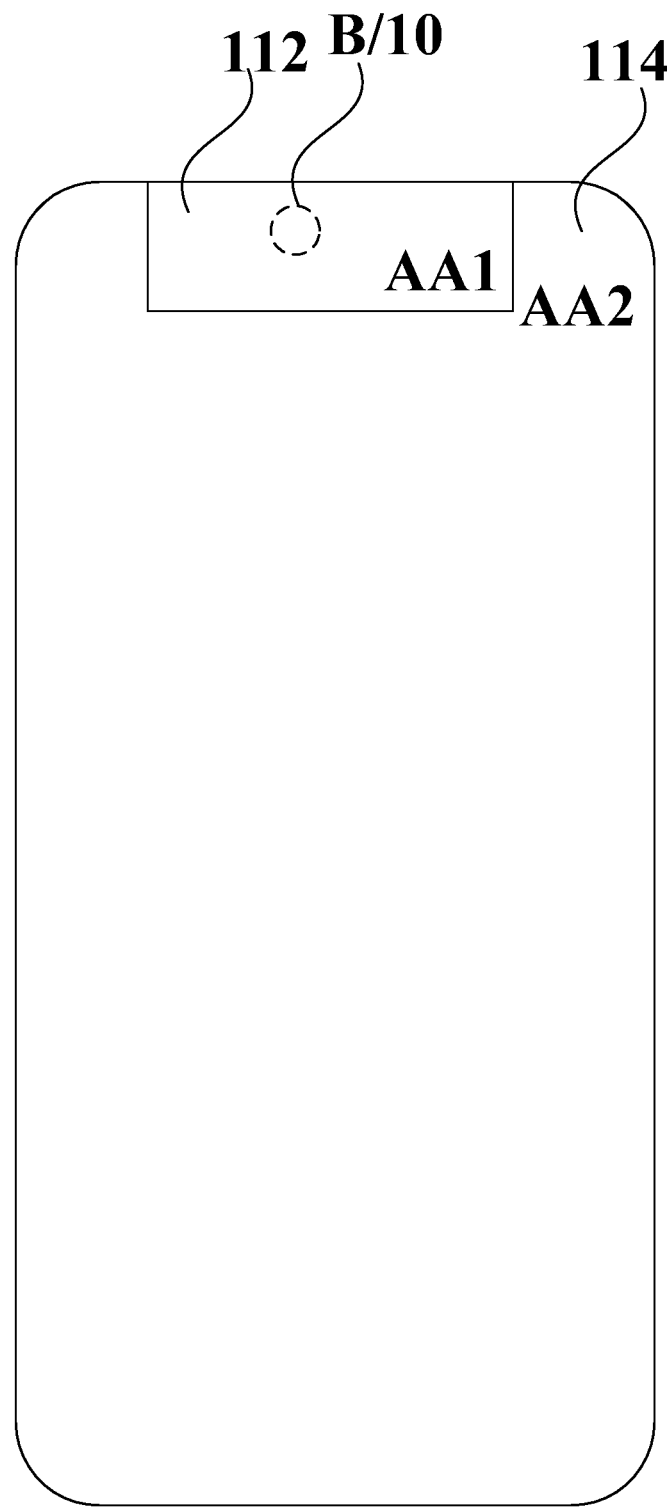
FIG. 14 is a top structural schematic diagram of a display device provided in an embodiment of the present application.

The present application further provides a display device, FIG. 13 is a cross-sectional structure schematic diagram of a display panel provided in an embodiment of the present application, and FIG. 14 is a top structural schematic diagram of a display device provided in an embodiment of the present application. In conjunction with FIGS. 13 and 14, the display device includes an equipment body 8 and a display screen 9, the display screen 9 covers the equipment body 8 and is mutually connected to the equipment body 8, an arrow in FIG. 13 indicates an incident direction of external light, and the display screen 9 may adopt the display screen 9 described above and is used for displaying static or dynamic pictures. Therefore, the display device provided in the present application also has the beneficial effects described above, which however are not to be detailed herein again.

In conjunction with FIGS. 13 and 14, the equipment body 8 in the display device has a device region B, the device region B is located below the first display region AA1 of the display screen 9, and the device region B is provided with a photosensitive device 10 for light collection through the first display region AA1. In conjunction with FIGS. 13 and 14, the equipment body 8 may be provided with a slotted region 112 and a non-slotted region 114, the slotted region 112 corresponds to the first display region AA1, a photosensitive device 10 such as a camera and a light sensor may be disposed in the slotted region 112, and a display panel of the first display region AA1 of the display screen 9 fits together corresponding to the slotted region 112, so that the photosensitive device 10 such as a camera and a light sensor may collect external light and the like through the first display region AA1. Due to a fact that the display panel disposed in the first display region AA1 may significantly improve the diffraction phenomenon generated when external light transmits through the first display region AA1, whereby the quality of images shot by a camera in the display device may be significantly improved, and distortion of the shot images caused by diffraction is avoided, and meanwhile, the accuracy and the sensitivity of the light sensor for sensing external light may be improved. Exemplarily, the display device may be a digital equipment such as a mobile phone, a tablet, a palmtop, or an iPod™.

Figure 15:
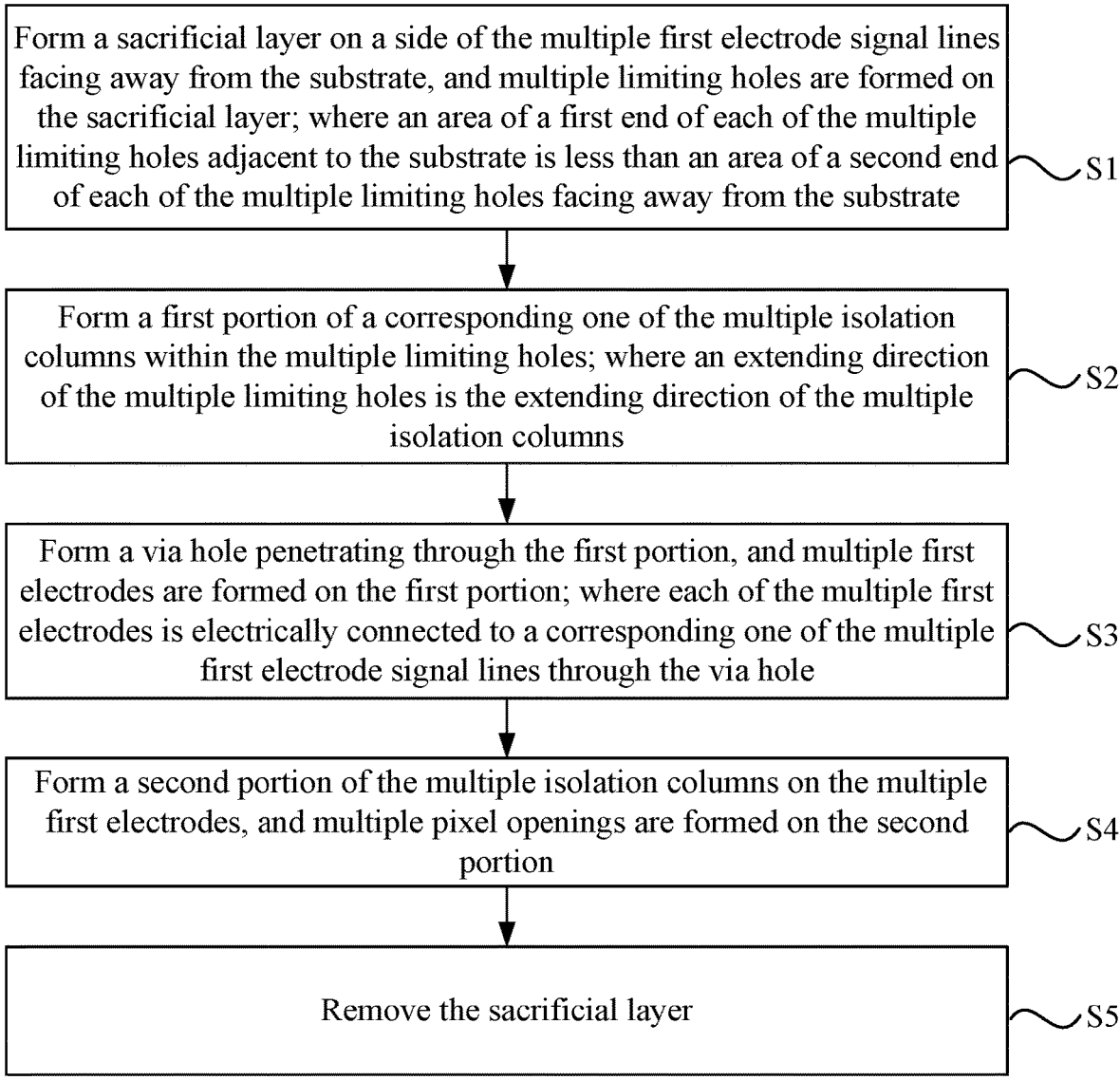
FIG. 15 is a flowchart of a manufacturing method of a display panel provided in an embodiment of the present application.

The present application further provides a manufacturing method of a display panel, the manufacturing method is used for manufacturing the display panel described above, FIG. 15 is a flowchart of a manufacturing method of a display panel provided in an embodiment of the present application, and as shown in FIG. 15, the manufacturing method of the display panel includes described above.

In S1, a sacrificial layer is formed on a side of the multiple first electrode signal lines facing away from the substrate, and multiple limiting holes are formed on the sacrificial layer; where an area of a first end of each of the multiple limiting holes adjacent to the substrate is less than an area of a second end of each of the multiple limiting holes facing away from the substrate.

Figure 16:
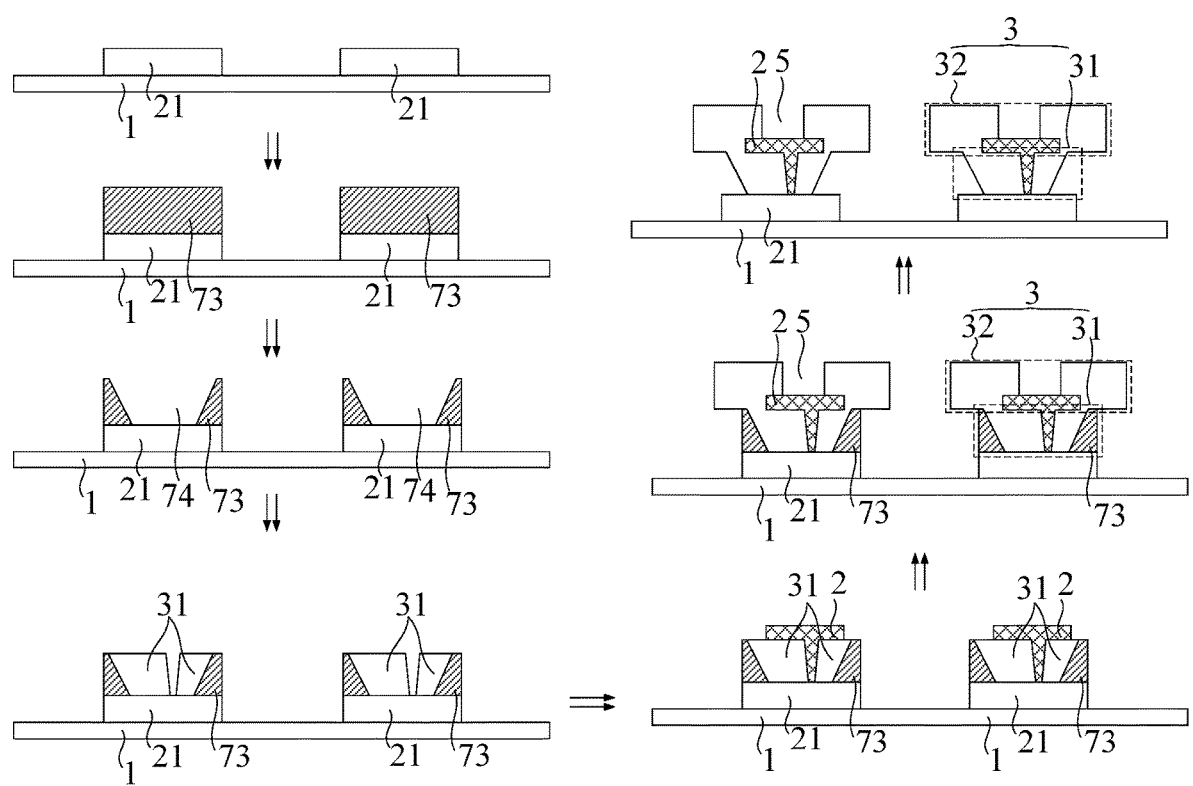
FIG. 16 is a structural diagram of a manufacturing process of a display panel provided in an embodiment of the present application.

FIG. 16 is a structural diagram of a manufacturing process of a display panel provided in an embodiment of the present application. In conjunction with FIGS. 1 to 16, a substrate 1 may be provided firstly, then multiple first electrode signal lines 21 are formed on the substrate 1, then a sacrificial layer 73 is formed on a side of the multiple first electrode signal lines 21 facing away from the substrate 1, the sacrificial layer 73 may be made of indium gallium zinc oxide or indium zinc oxide, and multiple limiting holes 74 are formed on the sacrificial layer 73; an area of a first end of the limiting hole 74 adjacent to the substrate 1 is less than an area of a second end of the limiting hole 74 away from the substrate 1, for example, the limiting hole 74 forms an inverted trapezoidal structure in FIG. 16.

In S2, a first portion of a corresponding one of the multiple isolation columns is formed within the multiple limiting holes; where an extending direction of the multiple limiting holes is the extending direction of the multiple isolation columns.

In conjunction with FIGS. 1 to 16, a first portion 31 of a corresponding one of the multiple isolation columns 3 is formed within the multiple limiting holes 74, the extending direction of the limiting holes 74 is the extending direction of the isolation columns 3, the formed limiting holes 74 are set to extend in the second direction YY', and further, the isolation columns 3 extending in the second direction YY' are formed, and thus a preparation is made for partitioning the second electrodes 6 between adjacent pixel regions a1.

In S3, a via hole penetrating through the first portion is formed, and multiple first electrodes are formed on the first portion; where each of the multiple first electrodes is electrically connected to a corresponding one of the multiple first electrode signal lines through the via hole.

In conjunction with FIGS. 1 to 16, the via hole penetrating through the first portion 31 is formed, multiple first electrodes 2 are formed on the first portion 31, the multiple first electrodes 2 is electrically connected to the corresponding first electrode signal lines 21 through the via hole so that the first electrode signal lines 21 may transmit first electrode signals to the multiple first electrodes 2, and when an insulating layer 7 is disposed between the isolation column 3 and the first electrode signal line 21, the via hole penetrates through the insulating layer 7 and the first portion 31 of the isolation column 3.

In S4, a second portion of the multiple isolation columns is formed on the multiple first electrodes 2, and multiple pixel openings are formed on the second portion.

In conjunction with FIGS. 1 to 16, a second portion 32 of the multiple isolation columns 3 is formed on the multiple first electrodes 2, multiple pixel openings 5 are formed on the second portion 32, and a light-emitting function layer 4 is formed within the multiple pixel openings 5.

In S5, the sacrificial layer is removed.

In conjunction with FIGS. 1 to 16, after the pixel openings 5 are formed, the sacrificial layer 73 is removed, so that the sacrificial layer 73 is patterned to manufacture the isolation column 3 of the desired shape, then the sacrificial layer 73 is removed, and a shape of the first portion 31 of the isolation column 3 adjacent to the substrate 1 is well controlled by using the sacrificial layer 73, so that the partition effect of the isolation column 3 on the second electrode 6 between adjacent pixel regions a1 is optimized. In addition, a thickness of the sacrificial layer 73 directly affects a thickness of the first portion 31 of the isolation column 3, if the thickness of the sacrificial layer 73 is too large, the thickness of the display panel will be increased, and if the thickness of sacrificial layer 73 is too small, the partition effect of isolation column 3 on the second electrode 6 between adjacent pixel region A1 will be affected.

In conjunction with FIGS. 1 to 16, the second electrode 6 is formed after the sacrificial layer 73 is removed, the partition region a2 is used for partitioning the second electrode 6 between the adjacent pixel regions a1, and then the transparent adhesive 70 is filled between adjacent isolation columns 3 in an ink-jet printing manner.

What is claimed is:

1. A display panel, comprising:
   a substrate;
   a plurality of first electrode signal lines formed on the substrate; and
   a plurality of isolation columns located on a side of the plurality of first electrode signal lines facing away from the substrate;
   wherein the display panel comprises a plurality of pixel regions and a plurality of partition regions, each pixel region of the plurality of pixel regions is internally provided with a respective one of the plurality of isolation columns, each of the plurality of isolation columns are internally provided with a plurality of pixel openings, and each pixel opening of the plurality of pixel openings is internally provided with a first electrode and a light-emitting function layer located on a side of the first electrode facing away from the substrate, the first electrode is electrically connected to a corresponding one of the plurality of first electrode signal lines, and each partition region of the plurality of partition regions is used for partitioning a plurality of second electrodes between two adjacent pixel regions.

2. The display panel of claim 1, wherein the each pixel region and the each partition region are alternately arranged in a first direction, the plurality of isolation columns extends in a second direction, the plurality of pixel openings in the each isolation column of the plurality of isolation columns is arranged in the second direction, and the first direction intersects with the second direction.

3. The display panel of claim 2, wherein the each isolation column is disposed in contact with the each first electrode signal line, the each first electrode signal line extends in the second direction, the first electrode is electrically connected to a corresponding one of the plurality of first electrode signal lines through a via hole penetrating through part of the each isolation column, and in the first direction, a vertical projection of the corresponding first electrode signal line electrically connected to the first electrode disposed in the each isolation column is located within a vertical projection of the each isolation column; or an insulating layer is disposed between the each isolation column and the each first electrode signal line, the each first electrode signal line extends in the first direction, and the first electrodes arranged in the first direction are electrically connected to a same first electrode signal line through a via hole penetrating through the insulating layer and part of the each isolation column.

4. The display panel of claim 1, wherein the each isolation column comprises a first portion adjacent to the substrate and a second portion facing away from the substrate, and in a direction parallel to the substrate, a cross-sectional area of the first portion is less than a cross-sectional area of the second portion; and wherein the first electrode is located on a surface of the first portion adjacent to the second portion, and the each pixel opening penetrates through the second portion.

5. The display panel of claim 1, wherein a gap between adjacent isolation columns is filled with a transparent adhesive.

6. The display panel of claim 5, wherein a refractive index of the transparent adhesive is same as a refractive index of the each isolation column.

7. The display panel of claim 5, wherein a surface of the transparent adhesive facing away from the substrate is lower than a surface of the each isolation column facing away from the substrate.

8. The display panel of claim 5, wherein a surface of the transparent adhesive facing away from the substrate is flush with a surface of the each isolation column facing away from the substrate.

9. The display panel of claim 8, further comprising a dam, disposed around all of the plurality of isolation columns, a thickness of the dam is greater than a thickness of the transparent adhesive, and the dam is configured to block the transparent adhesive.

10. The display panel of claim 9, wherein the dam is manufactured concurrently with at least part of the plurality of isolation columns.

11. The display panel of claim 1, wherein in an extending direction of the each isolation column, a width of a vertical projection of the each isolation column on the substrate changes continuously or intermittently in a direction perpendicular to the extending direction.

12. The display panel of claim 11, wherein the display panel comprises:
at least one side edge of the vertical projection of the each isolation column, close to the each pixel region, on the substrate is non-straight line shape,
wherein the non-straight line shape comprises at least one of a broken line segment, an arc shape or a wave shape.

13. The display panel of claim 11, wherein the display panel is a light-transmitting display panel, and a light transmittance of the display panel is greater than 15%.

14. The display panel of claim 11, wherein the first electrode and each of the plurality of second electrodes are light-transmitting electrodes, and the each first electrode signal line is a light-transmitting signal line.

15. The display panel of claim 11, wherein the first electrode is made of indium tin oxide (ITO) or indium zinc oxide (IZO), and the second electrode is made of the indium tin oxide (ITO), the indium zinc oxide (IZO) or a light-transmitting metal material.

16. A display screen, comprising at least one first display region provided with at least one display panel of claim 1;
wherein the display screen further comprises a second display region, the at least one display panel disposed in the at least one first display region is a passive matrix OLED (PMOLED) display panel and is a light-transmitting display panel, and a display panel disposed in the second display region is an active matrix OLED (AMOLED) display panel.

17. The display screen of claim 16, wherein the display screen comprises at least one of:
the second display region is disposed completely or partially around the at least one first display region; or
a thickness of the at least one display panel disposed in the at least one first display region is same as a thickness of the display panel disposed in the second display region.

18. The display screen of claim 16, wherein,
the at least one display panel disposed in the at least one first display region and the display panel disposed in the second display region share a substrate and an encapsulation layer, and a light-emitting function layer in the at least one display panel disposed in the at least one first display region is manufactured simultaneously with a light-emitting function layer of the display panel disposed in the second display region.

\* \* \* \* \*